United States Patent
Baerd et al.

(10) Patent No.: US 10,098,266 B2
(45) Date of Patent: Oct. 9, 2018

(54) DEIONIZED-WATER COOLING SYSTEM FOR ELECTRICAL EQUIPMENT

(75) Inventors: Henri Baerd, Champagne sur Seine (FR); Guillaume Godfroy, Versailles (FR)

(73) Assignee: GE Energy Power Conversion Technology Limited, Warwickshire (GB)

(*) Notice: Subject to any disclaimer, the term of this patent is extended or adjusted under 35 U.S.C. 154(b) by 359 days.

(21) Appl. No.: 13/490,150

(22) Filed: Jun. 6, 2012

(65) Prior Publication Data

US 2013/0056181 A1 Mar. 7, 2013

(30) Foreign Application Priority Data

Jun. 7, 2011 (FR) ...................................... 11 54937

(51) Int. Cl.
  *H01L 23/473* (2006.01)
  *H05K 7/20* (2006.01)
(52) U.S. Cl.
  CPC ....... *H05K 7/20927* (2013.01); *H01L 23/473* (2013.01)
(58) Field of Classification Search
  CPC .................................................... H01L 23/473
  USPC ..... 165/104.31, 104.25, 104.33, 45; 361/699
  See application file for complete search history.

(56) References Cited

U.S. PATENT DOCUMENTS

| | | | | |
|---|---|---|---|---|
| 2,970,232 A | * | 1/1961 | Kilbourne | 310/54 |
| 4,302,291 A | * | 11/1981 | Severs et al. | 376/293 |
| 4,430,129 A | * | 2/1984 | Gamer | 134/22.19 |
| 4,432,878 A | * | 2/1984 | Emshoff et al. | 210/662 |
| 4,682,068 A | * | 7/1987 | Cotzas et al. | 310/198 |
| 6,317,332 B1 | * | 11/2001 | Weber | B60R 16/0239 310/71 |

(Continued)

FOREIGN PATENT DOCUMENTS

| CN | 201584884 | * | 9/2010 |
|---|---|---|---|
| CN | 201584884 U | | 9/2010 |

(Continued)

OTHER PUBLICATIONS

Imazeki, JP2002100383TRANS (English Translation), Apr. 2002, JP.*
Search Report for French Application No. 1154937 dated May 30, 2012.

*Primary Examiner* — Len Tran
*Assistant Examiner* — Eric Ruppert
(74) *Attorney, Agent, or Firm* — Wood IP LLC

(57) ABSTRACT

Provided is a deionized-water cooling system having a main circuit for cooling electrical equipment. The system includes a deionizer circuit including (i) a deionizer for producing deionized water and (ii) a throttle and a main pumping system configured for circulating (i) the deionized water within the main circuit at a first flow rate and (ii) the water flow within the deionizer at a second flow rate. The circulating occurring when the electrical equipment is operating. The electrical equipment is configured for receiving power from a primary power source. Also included is a secondary pumping system configured for (i) receiving power from a secondary power source, (ii) circulating the deionized water within the main circuit, and (iii) circulating the water flow within the deionizer at the second flow rate via the throttle when the electrical equipment is inoperable.

8 Claims, 2 Drawing Sheets

(56) References Cited

U.S. PATENT DOCUMENTS

Figure 1:
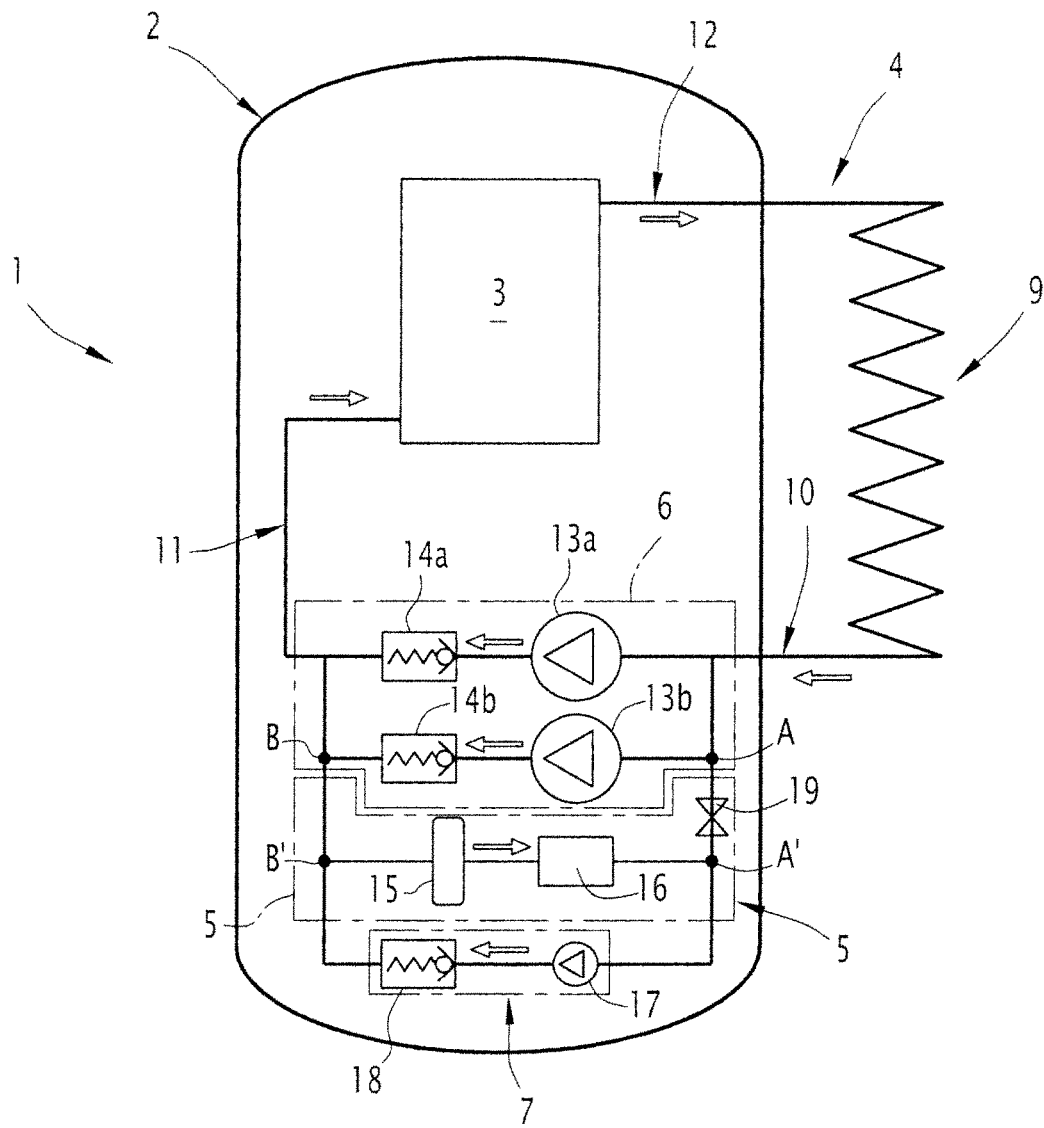

| | | | |
|---|---|---|---|
| 2002/0164511 A1* | 11/2002 | Uozumi | H01M 8/04029 |
| | | | 429/429 |
| 2003/0072981 A1* | 4/2003 | Imaseki et al. | 429/13 |
| 2007/0204984 A1* | 9/2007 | Limbeck | 165/202 |
| 2009/0211736 A1 | 8/2009 | Aoki | |
| 2009/0269636 A1* | 10/2009 | Craft et al. | 429/24 |
| 2009/0317680 A1* | 12/2009 | Imamura et al. | 429/26 |
| 2010/0254087 A1* | 10/2010 | Godfroy | 361/699 |

FOREIGN PATENT DOCUMENTS

| | | | |
|---|---|---|---|
| GB | 1017230 | * | 1/1966 |
| JP | 2002100383 | * | 4/2002 |
| WO | 2008/055515 A1 | | 5/2008 |

* cited by examiner

DEIONIZED-WATER COOLING SYSTEM FOR ELECTRICAL EQUIPMENT

CROSS REFERENCE TO RELATED APPLICATIONS

The present application claims priority to under 35 U.S.C. § 119 to French Patent Application No. 1154937, filed on Jun. 7, 2011, which is incorporated herein by reference.

I. TECHNICAL FIELD

This invention concerns a deionized-water cooling system for electrical equipment.

The invention applies in particular to underwater electronic and electrotechnical equipment protected in water-proof housings for depths of 0 to approximately 6,000 meters in particular distribution or transmission systems, as well as power converters typically of 100 kVA to several hundred MVA.

II. BACKGROUND

Such equipment must generally be cooled. A known-art cooling method consists in having deionized, cooled water circulate in the equipment in question. The circulation of the water is ensured using pumps requiring a significant amount of electrical power, on the order of 5-30 kVA.

These pumps are supplied with electrical power by a power supply external to the equipment in question. In order to maintain an appropriate deionization level in the cooling water circuit, the pumps must be supplied during the normal operation of the equipment to be cooled, i.e., whilst the latter is running and had by the power grid, but also when the equipment is stopped and not powered up. In fact, it is generally not permitted to run electrical power through the equipment unless the deionization level of the cooling water is sufficient.

III. SUMMARY OF THE EMBODIMENTS

One objective of the invention is to provide a deionized-water cooling having an auxiliary power supply with a relatively insignificant power consumption while the equipment to be cooled is stopped.

To this end, the invention seeks to provide a deionized-water cooling system for electrical equipment, which equipment is electrically connected to a primary power source, characterized in that it includes:
  a main circuit to channel and cool the deionized water to be circulated within the electrical equipment;
  a main pumping system to circulate the deionized water within the main circuit;
  a main power source to supply the main pumping system;
  a deionization circuit connected to two points of the main circuit to deionize the water of the main circuit, which deionization circuit includes a deionizer;
  a secondary pumping system to circulate the deionized water within the deionizer; and
  a secondary power source to supply the secondary pumping system;
which secondary power source has less power than the main power source.

According to specific embodiments, the cooling system may include one or more of the following characteristics, individually or in all technically possible combinations;
  the ionization circuit is hydraulically mounted on the terminals of the main pumping system, and the secondary pumping system is hydraulically mounted on the terminals of a portion of the deionization circuit including the deionizer;
  it additionally includes elements to cause hydraulic pressure losses, which elements are actuated such that, when the main pumping system is stopped and the secondary pumping system is operating, the secondary pumping system circulates a first flow of deionized water in the main circuit and a second flow of deionized water in the deionizer;
  the elements to create the hydraulic pressure losses include one or more check valves located within the main pumping system and a throttle located within the deionization circuit outside of the portion of the deionization circuit on the terminals of which the secondary pumping system is mounted.

The invention also concerns an electrical system characterized in that it includes:
  electrical equipment intended to be supplied with electrical power by a primary power supply; and
  a deionized-water cooling system as described above, to cool the electrical equipment.

According to specific embodiments, the electrical system may include one or more of the following characteristics, individually or in all technically possible combinations:
  the main power source is connected to the main power supply of the electrical equipment;
  it additionally includes a water-proof housing, which housing protects the electrical equipment, the main pumping system, the deionizing circuit, and the secondary pumping system;
  the secondary power source is located outside of the housing;
  it is underwater;
  the electrical equipment is an electronic power converter.

The invention lastly concerns a method of cooling of an electrical system as described above, characterized in that it includes the following steps:
  when the electrical equipment is operating, power is supplied to the main pumping system of the cooling system by the main power source so as to circulate the deionized water in the main circuit and the deionization circuit of the cooling system, and
  when the electrical equipment is stopped, power is supplied to the secondary pumping system of the cooling system by the secondary power source in order to circulate deionized water in at least one portion of the deionization circuit including the deionizer and in the main circuit.

According to a specific embodiment, the electrical system may include the following characteristic:
  in the step in which the main pumping system is supplied with power, the secondary pumping system is stopped, and in the step in which the secondary pumping system is supplied with power, the main pumping system is stopped.

IV. DESCRIPTION OF THE DRAWINGS

Figure 2:
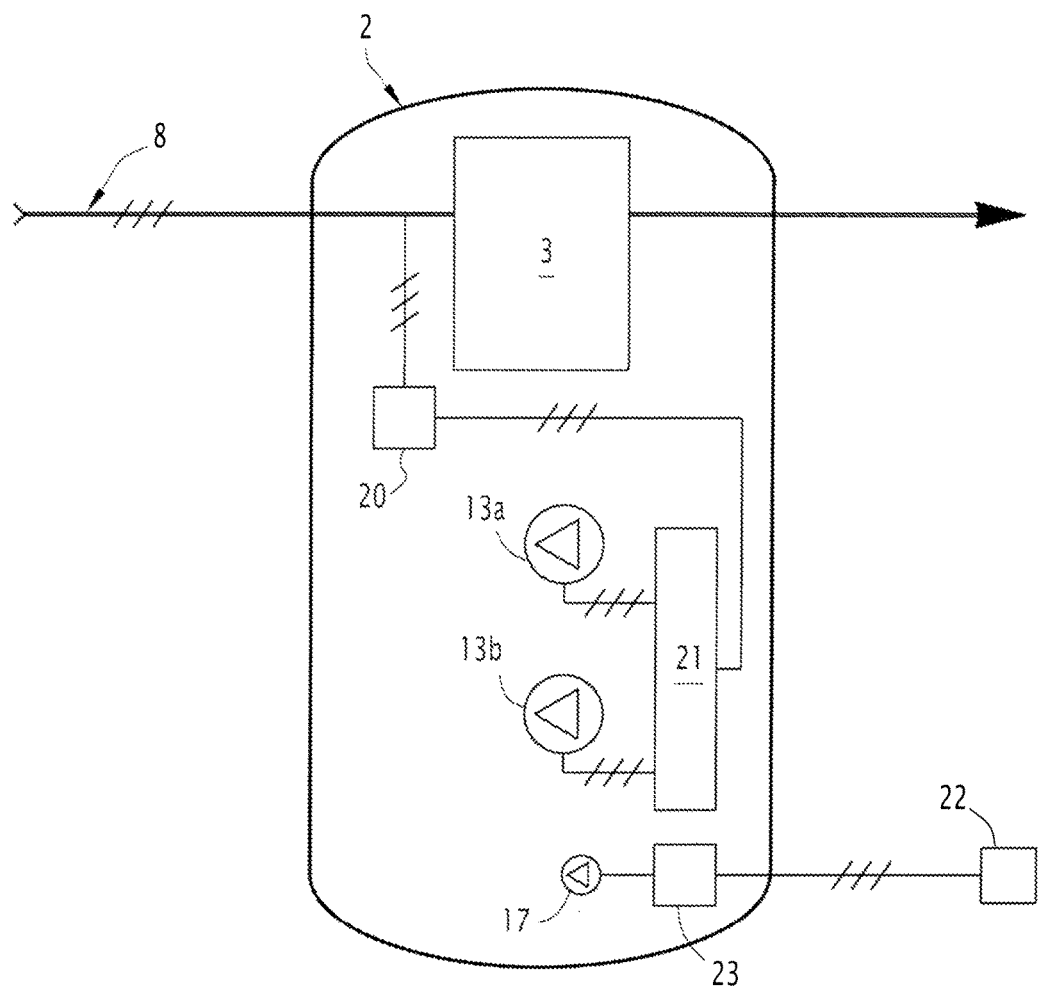

These invention will be more easily understood based on the following description, provided by way of example only, and by reference to the drawings appended hereto, on which:

FIG. 1 is a partial schematic of a system disclosed by the invention, focusing on the hydraulic aspects, FIG. 2 is a partial schematic of a system disclosed by the invention, focusing on the electrical aspects.

V. DETAILED DESCRIPTION OF THE EMBODIMENTS

The electrical system 1 shown in FIGS. 1 and 2 is intended to be submerged, in particular in the sea. It includes a housing 2, electrical equipment 3, a main circuit 4 for the cooling of the electrical equipment 3, a deionization circuit 5 to deionize the water of the main circuit 4, a main pumping system 6, and a secondary pumping system 7.

The housing 2 is designed to be water-proof in conditions arising due to the immersion of the electrical equipment 3.

The electrical equipment 3 is a power converter, having power ranging from 50 kVA to several hundred MVA. The electrical equipment 3 is electrically connected to an underwater electrical cable 8 (shown in FIG. 2), forming a primary power supply, and converts the power supplied by this supply.

The main circuit 4 includes a heat exchanger 9 and deionized water conduits 10, 11 and 12. The heat exchanger 9 is located outside the housing 2 to carry out heat exchange between the deionized water and external water so as to cool the deionized water. The output of the heat exchanger 9 is connected hydraulically to the main pumping system 6 via the deionized water conduit 10. The output of the main pumping system 6 is hydraulically connected by the deionized water conduit 11 to an input of the electrical equipment 3. The deionized water that has circulated within the electrical equipment 3 is recovered in the deionized water conduit 12, returning it to the heat exchanger 9. The main pumping system 6 is intended to move the deionized water in the main circuit 4 and in the deionization circuit 5. The main circuit 4 and the main pumping system 6 form a loop.

The main pumping system 6 includes a first pumping assembly 13a, 14a, consisting of a pump 13a and a check valve 14a located on the discharge of the pump 13a. The main pumping system 6 also includes a second pumping assembly 13b, 14b mounted parallel to the first pumping assembly 13a, 14a, and also consists of a pump 13b and a check valve 14b located at the discharge of the pump 13b. The second pumping assembly 13b, 14b is redundant, improving the reliability of the main pumping system 6.

The deionization circuit 5 is presented as an open circuit, mounted hydraulically parallel to the terminals A and B of the main pumping system 6. Thus, the main pumping system 6 may move the deionized water in the main circuit 4 and the deionization circuit 5; the flows within these two circuits may be different.

The deionization circuit 5 includes a deionizer 15 and a flow-controlling element 16 following the deionizer 15. In this example, the deionizer 15 includes a bottle containing a resin, and the flow-controlling element 16 is a gate controlled by a resistance indicator of the deionized water. The role of the deionization circuit 5 is to maintain a certain deionization rate, verifiable, for example, by a measure of the resistance of the deionized water in the main circuit 4. If the measured resistance decreases, the flow-controlling element 16 permits a greater flow in the deionization circuit 5 in order to increase deionization.

The secondary pumping system 7 includes a pump 17 and a check valve 18 located downstream from the pump 17. The secondary pumping system 7 is presented as an open circuit, hydraulically mounted on the terminals A' and B' of a portion of the deionization circuit 5, including the deionizer 15 and the flow-controlling element 16. A throttle 19 is included in the deionization circuit 5, between points A and A', in another portion of the deionization circuit 5 than that to the terminals A' and B' of which the secondary pumping system 7 is mounted. Thus, the secondary pumping system 7 can ensure a water flow within the deionizer 15 and a flow within the main circuit 4. The throttle 19 allows for regulation of the flow within the main circuit 4. The greater the throttle 19, the greater the flow in the deionizer 15.

On the electrical schematic shown in FIG. 2, the pumps 13a, 13b of the main pumping system 6 are connected electrically to a main power source 20, which, in turn, is connected to the power cable 8 of the electrical equipment 3. The role of this main power source 20 is to process the power supplied, from 5 to 30 kVA, to a switch 21 and control board of the pumps 13a, 13b. When the electrical equipment 3 is supplied with power, the main pumping system 6 may therefore be supplied with power without using an auxiliary source.

The pump 17 of the secondary pumping system 7 is electrically connected to a secondary power source 22, on the order of 1 kVA, via an electrical switch board 23. Thus, the secondary pumping system 7 may supply power even when the electrical equipment 3 is not powered up. The secondary power source 22 is outside of the water-proof housing 2. It is relatively small in volume, and, when it is used to supply the secondary pumping system 7, does not entail significant power consumption. Additionally, the secondary power source 22 may be more easily backed up, due to its size, than the main power source 20.

The operation of the system is described below. When the electrical equipment 3 is operating (normal mode), only one of the pumping assemblies of the main pumping system 6 is actuated. This ensures a flow on the order of 10-200 m$^3$/h in the main circuit 4 and 25-500 l/h in the deionization circuit 5. The power supply for the pumps thus originates solely from the main power source 20, which power is taken from the cable 8 supplying the electrical equipment 3.

When the electrical equipment 3 is stopped ("stop" mode), only the secondary pumping system 7 is operating. This ensures a reduced flow within the main circuit 4, on the order of 100 l/h-2 m$^3$/h, and a flow through the deionizer 15 sufficient to allow for deionization. The flow that can be obtained in the deionizer 15 is greater than or equal to that existing within the deionizer 15 during normal operating mode (25-500 l/h). The throttle 19 allows for control of the flow via the deionizer 15.

Thus, in "stop" mode, the power required by the pumping system 7 may be supplied by a power source 22 of approximately 1 kVA, This power is lower by approximately one order of magnitude than that required when the main pumping system 6 must be actuated (5-30 kVA). The secondary power source 22 used is thus reduced in size. The power consumed by the pumping system 7 in "stop" mode is also reduced to an analogous degree.

In other words, the invention reaches its objective due to the fact that, while the electrical equipment 3 to be cooled is operating and significant electrical power is required to actuate the pumps of the main pumping system 6, these are supplied with electrical power by a main power source 20 connected to the power cable 8 of the electrical equipment 3 to be cooled. When, on the other hand, the latter is not in operation, a secondary pumping system 7 is used to move the water in the deionizer 15 and the main circuit 4. The water flow is moderate then, because its principal objective is to maintain an appropriate deionization level. This flow also allows for heat exchange between the electrical equipment 3 and the external environment. This is useful, e.g., following a cold shutdown of the electrical equipment 3, when the secondary power source 7 may have been backed up in order to ensure the evacuation of the residual heat from the electrical equipment 3.

Accordingly, the secondary pumping system 7 may be supplied by a secondary power source 22 smaller than that required for the main pumping system 6, on the order of 1 kVA. This corresponds to a reduction of approximately one order of magnitude. The power consumed by the cooling system in "stop" mode is also reduced to an analogous degree.

According to another embodiment, not shown, the deionization circuit 5 may follow the main pumping system 6. The parallel connection showed by FIG. 1, however, has the advantage of the flow within the deionizer 15 being able to be different to the flow within the main circuit 4.

According to another embodiment, the throttle 19 may be placed, in the deionization circuit 5, on the side opposite the deionizer 15, between points B and B'. It may also be placed in the main circuit 4, but this has the disadvantage of creating a pressure loss that must be overcome by the main pumping system 6, resulting in a loss of power in "normal" operation.

According to another embodiment (not shown), the main power source 20 connected to the power cable 8 is backed up. This allows for continued use of the main power source 20 to supply the main pumping system 6, even when the electrical equipment 3 is not supplied by the cable 8.

According to an alternative embodiment (not shown), the main power source 20 is an autonomous power source, not connected to the cable 8. This allows for continued use of the main power source 20 to supply the main pumping system 6, even when the electrical equipment 3 has no power supply.

The continued use of the main pumping system 6, when the electrical equipment 3 is stopped, creates a need to cool the electrical equipment 3, e.g., following a cold shutdown, when a significant amount of heat must be evacuated.

The invention claimed is:

1. A deionized-water cooling system having a main circuit for cooling electronic equipment, the system comprising:
   a main pumping system configured for circulating (i) deionized water within a main circuit at a first flow rate (ii) a water flow within a deionizer at a second flow rate, and (iii) the electronic equipment is configured for receiving power from a primary power source when operating in a normal operating mode;
   a secondary pumping system configured for (i) receiving power from only a secondary power source, when the electronic equipment is inoperable and the main pumping system is stopped, (ii) circulating the deionized water within the main circuit at a flow rate less than the first flow rate, and (iii) circulating the water flow within the deionizer at a flow rate equal to or greater than the second flow rate;
   a deionizer circuit including the deionizer for producing deionized water, wherein the deionizer circuit is configured to controllably vary a deionization rate of the deionized water by measuring a resistance of the deionized water in the main circuit and increasing the deionization when the resistance measured is decreased; and
   a throttle configured for regulating the water flow within the main circuit, the throttle and the secondary pumping system are connected along different paths of the deionizer circuit;
   wherein the deionizer circuit comprises the throttle, the throttle being configured to facilitate the waterflow within the deionizer; and
   wherein the main pumping system is located internal to a water-proof housing.

2. The deionized-water cooling system according to claim 1, wherein the deionization circuit is hydraulically mounted on terminals of the main pumping system; and the secondary pumping system is hydraulically mounted to terminals of a portion of the deionization circuit including the deionizer.

3. The deionized-water cooling system of claim 1, wherein the secondary power source has less power than the main power source.

4. An electrical system comprising:
   a main pumping system configured for circulating (i) deionized water within a main circuit at a first flow rate (ii) a water flow within a deionizer at a second flow rate, the circulating occurring when the electronic equipment is operating in a normal operating mode, and (iii) the electronic equipment is configured for receiving power from a primary power source when operating in the normal operating mode;
   a secondary pumping system configured for (i) receiving power from only a secondary power source, when the electronic equipment is inoperable and the main pumping system is stopped, (ii) circulating the deionized water within the main circuit at a flow rate less than the first flow rate, and (iii) circulating the water flow within the deionizer at a flow rate equal to or greater than the second flow rate;
   a deionizer circuit configured for cooling electronic equipment, the deionizer circuit including (i) the deionizer for producing deionized water and (ii) a throttle wherein the deionizer circuit is configured to controllably vary a deionization rate of the deionizer water, by measuring a resistance of the deionized water and increasing the deionization when the resistance measured is decreased; and
   wherein the throttle being configured for regulating the water flow within the main circuit, the throttle and the secondary pumping system are connected along different paths of the deionizer circuit;
   wherein the deionizer circuit comprises the throttle, the throttle being configured to facilitate the waterflow within the deionizer; and
   wherein the main pumping system is located internal to a water-proof housing.

5. The electronic system according to claim 4, wherein the water-proof housing is configured for protecting the electronic equipment, the main pumping system, the deionization circuit, and the secondary pumping system.

6. The electronic system according to claim 4, wherein the electronic equipment is an electronic power converter.

7. A method of cooling electronic equipment comprising:
   producing deionized water, via a deionizer circuit including a deionizer, for cooling the electrical equipment;
   controllably varying a deionization rate of the deionized water;
   circulating, via a main pumping system, (i) the deionized water across the electrical equipment at a first flow rate and (ii) the water flow within the deionizer at a second flow rate, the circulating occurring when the electronic equipment is operating in a normal operating mode wherein power is supplied to the electrical equipment;
   wherein the electronic equipment is configured for receiving the power from a primary power source when operating in the normal operating mode and the primary power source is internal to a water proof-housing;

circulating, via a secondary pumping system, when the electronic equipment is inoperable and the main pumping system is stopped, (i) the deionized water within the main circuit at a flow rate less than the first flow rate and (ii) the water flow within the deionizer at a flow rate equal to or greater than the second flow rate;

regulating the water flow within the main pumping system via a throttle; and facilitating the water flow within the deionizer via the throttle;

wherein the throttle being located in the deionizer circuit; and wherein the throttle and the secondary pumping system are connected along different paths of the deionizer circuit.

8. A deionized-water cooling system having a main circuit, the system comprising:

a main pumping system configured for circulating (i) deionized water within a main circuit at a first flow rate (ii) a water flow within a deionizer at a second flow rate, and (iii) the electronic equipment is configured for receiving power from a primary power source when operating in a normal operating mode;

a secondary pumping system configured for (i) receiving power from only a secondary power source, when the electronic equipment is inoperable and the main pumping system is stopped, (ii) circulating the deionized water within the main circuit at a flow rate less than the first flow rate, and (iii) circulating the water flow within the deionizer at a flow rate equal to or greater than the second flow rate;

a deionizer circuit comprising the deionizer;

wherein the deionizer circuit comprises a throttle; and wherein the throttle and the secondary pumping system are connected along different paths of the deionizer circuit.

* * * * *